United States Patent [19]
Baier et al.

[11] Patent Number: 4,570,180
[45] Date of Patent: Feb. 11, 1986

[54] METHOD FOR AUTOMATIC OPTICAL INSPECTION

[75] Inventors: Heinz Baier, Sindelfingen; Peter Köpp, Schoenbuch; Martin Schneiderhan, Stuttgart; Hans-Peter Reimann, Sindelfingen; Hans Rösch, Reutlingen-Sondelfingen; Erwin Pfeffer, Holzgerlingen, all of Fed. Rep. of Germany

[73] Assignee: International Business Machines Corporation, Armonk, N.Y.

[21] Appl. No.: 498,333

[22] Filed: May 26, 1983

[30] Foreign Application Priority Data

May 28, 1982 [EP] European Pat. Off. ........ 82104731.3

[51] Int. Cl.⁴ ............................................. H04N 7/18
[52] U.S. Cl. .................................. 358/106; 358/101; 382/8; 382/22
[58] Field of Search .................... 358/101, 106, 107; 382/8, 22; 356/394, 408; 324/73 R, 73 AT

[56] References Cited

U.S. PATENT DOCUMENTS

| | | |
|---|---|---|
| 4,056,716 | 11/1977 | Baxter et al. |
| 4,059,787 | 11/1977 | Aimar .......................... 318/568 |
| 4,194,113 | 3/1980 | Fulks ............................ 324/73 R |
| 4,295,198 | 10/1981 | Copeland et al. |
| 4,345,312 | 8/1982 | Yasuye .......................... 382/8 |
| 4,402,055 | 8/1983 | Lloyd ............................ 324/73 AT |

OTHER PUBLICATIONS

Th. Ricker & J. Schurmann "Mask and Pattern Inspection Systems"-NTG Fachberichte, vol. 60 (1977) pp. 229-234.

Primary Examiner—Howard W. Britton
Attorney, Agent, or Firm—Barbara A. McDowell; Joseph F. Villella; Mark Levy

[57] ABSTRACT

Method and apparatus for automatic optical inspection of a substantially two-dimensional pattern using digital image processing techniques are described. In a first processing step, all regions of a digitized stored image derived from the two-dimensional pattern are scanned for edges or lines, that is, transitions between regions having optically different characteristics. The scanned edge regions are marked in the image storage. In a subsequent second processing step all non-marked regions of the image storage are scanned and tested for the presence of permissible grey levels. A meander-shaped scanning track is used for scanning the edge or lined regions. The apparatus for implementing this method includes special latch circuitry for eliminating the further processing of marked regions, thus increasing the overall speed at which the two-dimensional pattern can be optically inspected.

7 Claims, 11 Drawing Figures

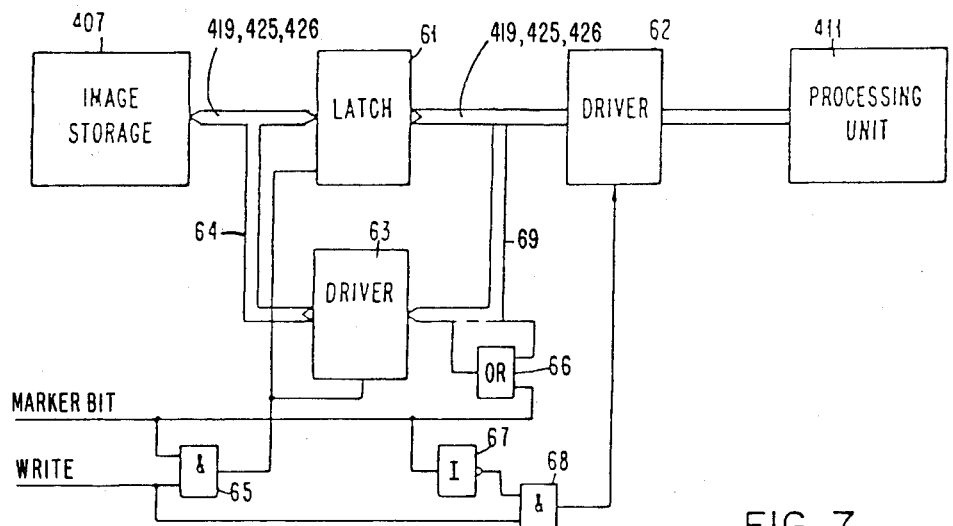
FIG. 5
FIG. 6
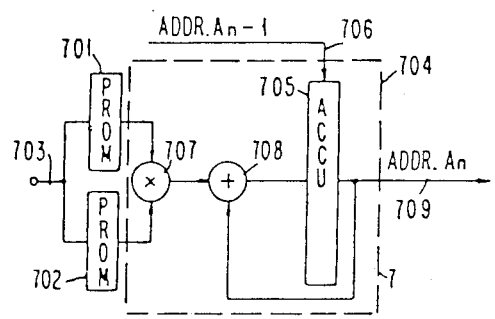
FIG. 7
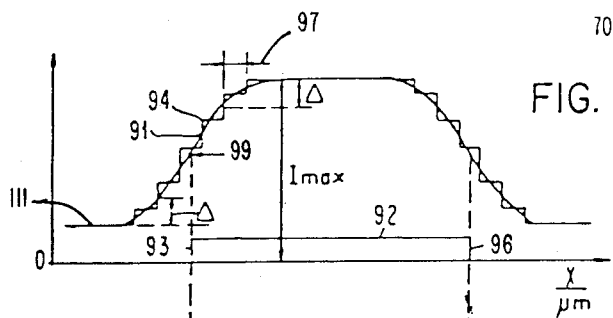
FIG. 9A
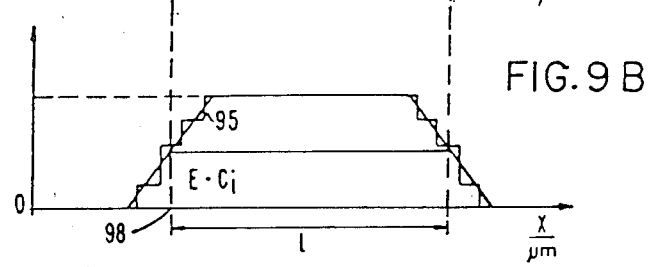
FIG. 9B

METHOD FOR AUTOMATIC OPTICAL INSPECTION

DESCRIPTION

1. Technical Field

This invention relates to a method and an apparatus for automatic optical inspection.

2. Background Art

In many fields of technology, particularly in connection with manufacturing processes, it has been tried for a long time to replace visual object inspection or testing by automated processes so as to permit a faster, more accurate and reliable result. Potential applications for such automated apparatus are the handling of components (using, for example, robots), pattern recognition, or quality testing.

A particularly urgent problem is the visual testing of complex, substantially two-dimensional patterns, as can be found on printed circuit boards or in photolithographic masks. Defects in such products should be detected one hundred percent, otherwise they may lead to consequential defects in subsequent manufacturing steps, thus incurring very high costs. The small dimensions of the pattern elements and the high density of the patterns demand a high local resolution during testing, so that much time is required for each test process.

The electrical methods frequently used to test printed circuit boards fail to reveal all potential defects. A reduction of the conductor cross-section, for example, may pass unnoticed during electrical conductance testing, but the high current density in that area may lead to further changes and thus to an interruption of conductors when the boards are used later on. Apart from this, the electrical contacting of very dense conductor patterns is very difficult. For these reasons visual testing is indispensable but involves prohibitive labor cost and is not entirely reliable.

Proposals for automated optical quality control that have become known so far include the following approaches: (i) an optical system samples out non-defective pattern elements by spatial filtering; (ii) an optical apparatus compares the pattern to be tested point-by-point with a non-defective master; and finally, (iii) the use of digital image processing principles. The first two approaches necessitate relatively extensive optical means, very accurate adjustment, and are not very flexible. With digital image processing methods, image scanning produces large quantities of data, which are either highly time-consuming to process or necessitate extensive circuitry.

A known system for automated visual inspection (or, more generally speaking, for digital image processing), consists of an opto-electronic transducer, such as a TV camera followed by an analog-to-digital converter supplying binary numbers, corresponding to the grey values of the picture elements, to an image storage. For several hundred lines, each containing several hundred picture elements, (which is the size of section normally scanned), this storage must have a substantial capacity on the order of several hundred kilobytes. The stored binary images are processed by means of programs executed in a universal computer and/or special circuits provided for image evaluation, and the result is written back into storage for further processing. The processed image may be displayed on a monitor using a digital-to-analog converter.

One approach using digital image processing has an apparatus for defect testing the surface pattern of an object, whereby the binary image of the object is compared with an electronically stored non-defective pattern. This high-capacity pattern storage is very costly. Optical quality testing means for circuit boards have been described in another approach whereby only small sections of a pattern are tested to determine whether predetermined fundamental characteristics, such as conductor widths and the mutual spacing of conductors, have been observed. This test method fails to reveal, however, whether whole sections of the pattern have been omitted.

A serious disadvantage of all digital inspection systems that have become known so far is that even if the circuit means required are economically tolerable, for example, where a microprocessor is used for image analysis, they have very long processing times for testing a pattern or a section of a pattern. For mass producing printed circuit boards, a section of a pattern, entered into an image storage by a TV camera has to be tested in several hundred milliseconds, in order to adapt the processing speed to the speed at which the pattern to be tested is scanned. Scanning is effected at a high degree of magnification, so that it is possible to even detect picture elements with diameters of a few $\mu m$. At the high resolution required, systems presently employed for binary image processing have the further disadvantage that upon transition from a grey value image to the binary image a digitization error occurs at the position of the picture elements lying in the region of transition from a light to a dark area.

Accordingly, it is an object of this invention to provide an improved method for automatic optical inspection.

It is another object of this invention to provide a method for edge scanning a two-dimensional pattern using a meander-scanning technique.

It is still another object of this invention to provide a method and apparatus for analyzing a two-dimensional pattern wherein edge portions of the pattern are tested and marked in a first step, and all remaining portions of a pattern are tested in a second step.

It is still a further object of this invention to provide a method for analyzing a two-dimensional pattern wherein tested edge portions are marked in a memory using a marker bit.

DISCLOSURE OF THE INVENTION

This invention proposes a two-step test method for a digitization stored image derived from a test sample, wherein a first digital processing step is used to test and mark all those edge regions of the image storage which contain non-defective pattern elements, and wherein a second step serves to test all non-marked regions of the image storage at high speed for the presence of permissible grey levels. The apparatus for implementing the method uses a digital storage for storing the image with a bit of the digital word, which indicates the grey value of the associated picture element, being used as a marker bit during the test previously effected with respect to this picture element.

BRIEF DESCRIPTION OF THE DRAWINGS

FIG. 5 illustrates the format of an entry in the image storage for the grey value of a picture element with a marker bit according to the present invention.

FIG. 6 is a circuit for setting the marker bit.

FIG. 7 is a circuit for the fast computation of storage addresses in the apparatus according to FIG. 4.

FIGS. 9A and 9B show the edge profile of a conductor after scanning and normalization for explaining an operating mode of the processing unit according to FIG. 8.

BEST MODE FOR CARRYING OUT THE INVENTION

The present invention is based on the fact that with many types of images or graphics the information content is determined by a few picture elements. This applies, for example, to printed circuit boards and photolithographic masks in which the edges between light regions (e.g., conductors) and dark regions (e.g., base plate of insulating material) are of primary interest. In a non-defective circuit board structure, the edges must extend only in particular directions, they must be continuous and have particular minimum or maximum distances from each other. Apart from this, the number of geometrical partial figures in a pattern is limited in most cases.

Figure 1:
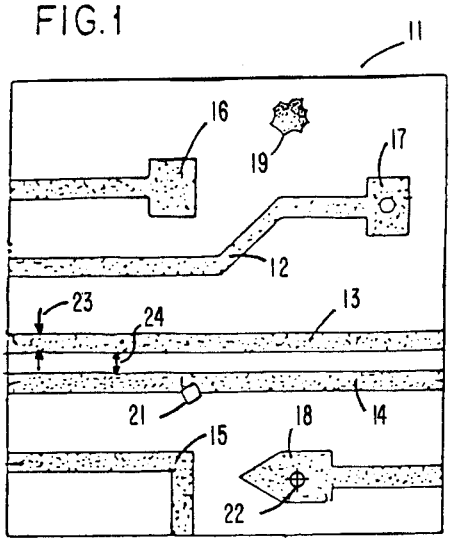
FIG. 1 is an enlarged section of a printed circuit board with typical pattern elements.
Figure 2:
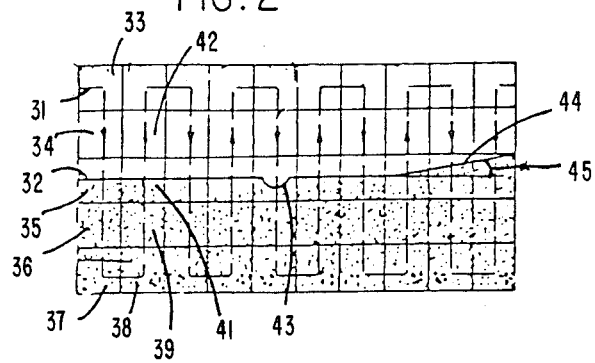
FIG. 2 shows an enlarged section of an edge of a conductor and a scanning track for an edge for determining the edge position of a pattern according to the method of the present invention.
Figure 4:
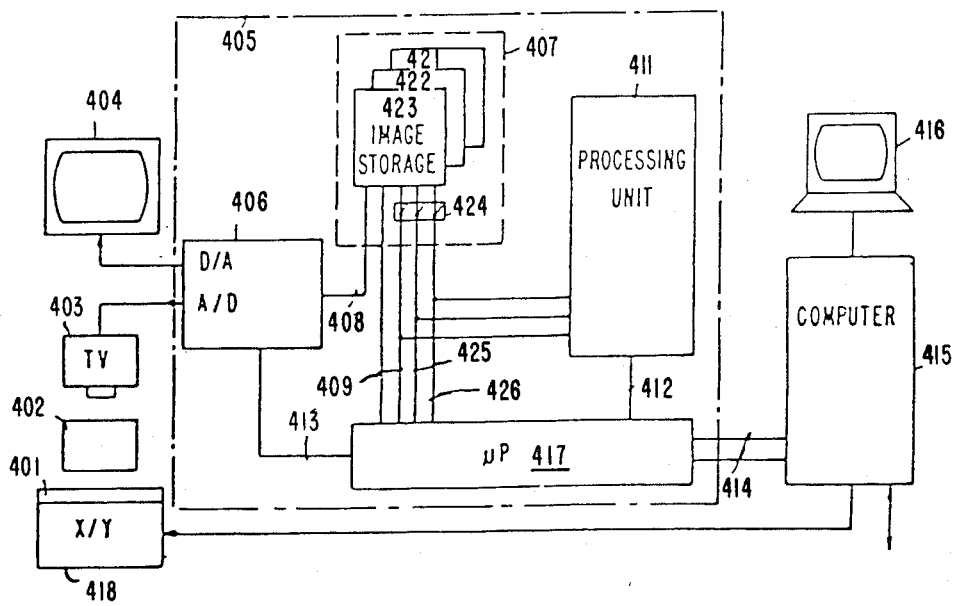
FIG. 4 is the block diagram of the apparatus for automatic optical inspection according to the present invention.

Referring to FIGS. 1, 2 and 4, a circuit board 401 to be tested is placed on XY table 418. Using optical system 402, the pattern on the circuit board is imaged into TV camera 403. The analog image produced by TV camera 403 is then transmitted to analog to digital converter 406. Note that device 406 also performs digital to analog conversion as will be described hereinafter. After the analog to digital conversion has been completed, the digitized representation of circuit board 401 is transmitted via line 408 to image storage 407 containing storage blocks 421, 422, and 423.

The digital image representation of circuit board 401 stored in storage 407 contains the grey values describing the state of lightness or darkness of the picture elements composing the image of circuit board 401. The image analysis is commenced by searching the stored image for an edge of a conductor pattern. An enlarged section of an edge 32 is shown in FIG. 2. After an edge has been located, the processing electronics begins a meander scanning, as indicated by scanning track 31 shown in FIG. 2.

The meander scanning track begins on one side of the edge that is being scanned, crosses that edge to the other side, reverses itself and returns to a point equally distant from the edge as the initial starting point, but displaced a distance down the edge. This meander scanning continues until the entire edge of a conductor has been tested. The processing electronics then seeks another edge and meander scans that edge to completion. This process continues until all edges in the storage have been scanned.

Each of the edges scanned during this procedure are marked in the memory using a marker bit. After all edges in the conductor pattern have been scanned and marked, the remaining sections of the image are then tested for allowable grey values. In this manner, the non-edge areas of a pattern to be tested may be examined without first having to reexamine the edge patterns already scanned. Only unmarked areas of the image storage are examined in this subsequent step.

FIG. 1 shows an enlarged section 11 of a circuit board with a typical pattern of elements. The dot-marked conductors 13, 14, each of which have a nominal width 23 and a minimum distance 24 therebetween, extend in straight lines represented by reference numerals 13 and 14, respectively; are bent through an angle of 45° or 90°, as represented by reference numerals 12 and 15, respectively; and never end abruptly but are each terminated by solder pads of such different shapes, as represented by reference numerals 16, 17, and 18. Defective areas in a conductor are to be found either at the insulating base plate 19, along an edge 21, or within a conductor at a point 22. Such a circuit board section may be tested to determine (1) whether the nominal width 23 and the minimum distance 24 have been locally observed; (2) whether there are defective regions in the insulating plate (e.g., at point 19) or inclusions in the conductors (e.g., at point 22); or (3) whether conductors or patterns exist and have been arranged relative to each other according to design specifications.

For the latter test, the design data have to be suitably edited and stored and compared with representative values of the actual pattern. The other two parameters can be tested anywhere in the pattern without referring to the design data.

Depending upon the respective structure of the system, the method proposed in accordance with the present invention permits local testing to be performed without or with reference to the design data. In the former case, the stored digital image of the pattern section to be tested (see FIG. 1) is systematically searched in a search mode until an edge is detected. In the latter case, the design data are used to address that position in storage where the grey value of the starting point of an edge is stored. In both cases, the edge thus detected is used as a starting point for meander-scanning the edge by computing the storage addresses which correspond to the picture elements on that line. A circuit arrangement for the fast determination of storage addresses of picture elements along this scanning track will be described later on in connection with FIG. 7.

If the edge of conductor 12 in FIG. 1, for example, is non-defective throughout and if all edges point in one of the permissible directions (e.g., horizontally, perpendicularly, through 45° or any other arbitrary angle), the end of conductor 12 will be finally reached and the scanning track can be moved on to the edge of another conductor.

Details as to the course of a scanning track 31 along an edge 32 are shown in FIG. 2. An algorithm to be described hereinafter applies to edges, but analogously also to lines or thin conductors, whose full width is meander-scanned. The individual picture elements (corresponding to the minimum local resolution of the image) are shown by way of squares 33, 34, 35, 36, 37, 38, 39, 41, 42, etc., in FIG. 2. Each leg of scanning track 31 extends perpendicularly to the edge direction and contains three entire picture elements, whose grey value is read from the image storage and used to form a sum $\Sigma$.

As the scanning track proceeds in the edge direction, the difference Δ of two successive sum values is formed using the grey values contained in two adjacent legs of track 31. If the edge 32 lies exactly perpendicular to the scanning track and has no local distortions, the difference Δ is always 0. A local change of the edge (e.g., an indentation 43 as shown in FIG. 2), which may be smaller than 1 picture element, changes the difference Δ to a value not equal to 0 which thus may be used to indicate a defect.

For example, the sum of the grey values for picture elements 34, 35, and 36 contained in a first leg of track 31 would form $\Sigma_1$. The sum of the grey values for picture elements 39, 41, and 42 contained in a second leg of track 31 would form $\Sigma_2$. Δ1 would thus be the difference between these two, i.e., $\Delta 1 = \Sigma_2 - \Sigma_1$. A complete change of the edge direction, for example, in the case of a bend 44 through an angle 41, leads to successive difference values being a direct function of the change of the edge direction.

The number of picture elements lying perpendicularly to the edge direction and contributing to the grey value sum must be chosen according to the respective edge curve in a pattern. The reversal points of the scanning track 31, i.e., those points at which it changes the direction in which it crosses the edge being scanned, should be outside the edge region. The reversal should not occur within a picture element used to form a sum. This is shown in the above example by observing that the first point of reversal takes place in picture elements 37 and 38, neither of which are used to form the sums $\Sigma_1$ and $\Sigma_2$.

Figure 3:
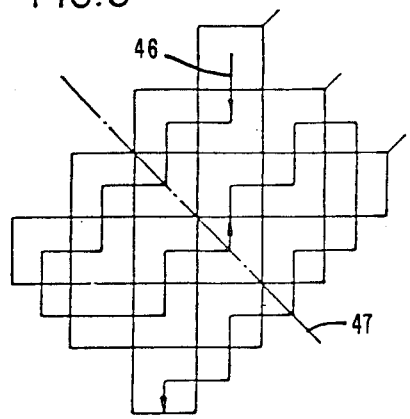
FIG. 3 displays picture elements used to form the differences of grey value sums in the case of transverse conductor edges according to the method of the present invention.

FIG. 3 shows the picture elements used for the grey value sum for edges less than 45°. For tracing arbitrary edges by means of this difference method, the most suitable basic direction (horizontal, perpendicular, 45°) is to be chosen and the grey value sum, computed as a function of it, to be corrected by adding a constant.

FIG. 3 is an equivalent to FIG. 2 for an edge running from the upper left of FIG. 2 to the lower right of FIG. 2. Once again, the scanning direction is perpendicular to the edge (dashed line 47 in FIG. 3) and has a step-like shape as shown by line 46. The sum of the grey values of perpendicular tracks are formed just as for an edge as shown in FIG. 2. The difference between adjacent sums is then taken to determine if any local distortions exists.

In addition to the above-described detection of edge defects, whose extension is of the order of one picture element or less (so-called high-frequency interference), it is also possible to detect low-frequency interference of the edge curve if the difference of the grey value sums, instead of being determined between adjacent edge points, is determined from edge points that are spaced farther apart.

Edge tracing according to the above-described scanning method detects all defects lying in the area of the scanning track of the edge, such as the inclusion 21 in FIG. 1. The addresses of these defective spots can be entered into a defect listing to be evaluated later on.

All points in the grey value passed during edge tracing and stored in the image storage are marked by assigning the value 1 to a bit of the digital word associated with the picture element. The lowest order bit of the digital number indicating the grey value level of the associated picture element is preferably used as a marker bit. As usually one byte with 8 bits is associated with each picture element in storage, the number of representable grey levels is reduced by the inclusion of the marker bit from $2^8$ or 256 to $2^7$ or 128. Thus, there are still sufficient grey values for producing an accurate image. FIG. 5 shows the format of such a stored seven-bit word with marker bit M and parity bit P.

In the first processing step of the test method according to the invention, all edges of image section 11 (see FIG. 1) are scanned and marked in the above-described manner, so that subsequently the non-marked areas should contain only grey value levels corresponding to a light region (e.g., conductors) or a dark region (e.g., an insulating plate). This scanning can also be extended to narrow conductors with a meander-shaped scanning track.

The second processing step of the method in accordance with the invention goes to very rapidly sequentially testing the image storage areas not marked during the first step to determine whether values other than light or dark ones exist. During this test, the storage is sequentially addressed. If values other than light or dark ones exist, the respective picture elements are defective spots of the circuit board (e.g., points 19 or 22). As even with complicated patterns, the proportion of edge or line areas is relatively small, the speed advantage obtained in the second method step can be utilized in full by filtering the edge or line areas in the first method step, so that testing an image or a section of it requires much less time than raster-scanning all picture elements, for which purpose each element has to be tested to determine whether there is an edge or a line.

The high processing speed afforded by the two-step compare mode can be increased further by using a digital processing system which is especially adapted to the requirements of this method. One very important feature of the apparatus for implementing the method is its storage system which permits very fast reading and writing.

FIG. 4 is a block diagram of such an apparatus with an X-Y table 418 on which a circuit board 401 to be tested is arranged. By means of an optical system 402, this circuit board is imaged in full or in part into a TV camera 403. It is preferable to use a TV measuring camera from which, to enhance the accuracy, a square 512×512 picture element section is withdrawn which is arranged in the center of the image area and which has a very low distortion. The output signal of the TV camera is fed to a system 405 for image analysis. In this system, an analog-to-digital converter 406 produces a digital image, whose individual picture elements are associated with one of 128 grey values. The digitized image is sent to an image storage 407 through a bus 408. Image storage 407 is connected through a further bus system 409, 425 to a microprocessor 417 and a processing unit 411 comprising circuits (not shown) for the fast processing of the image information contained in storage 407. Microprocessor 417 comprises control lines 412 and 413 for processing unit 411 and analog-to-digital converter 406, respectively, and is linked through a further line 414 with a computer 415 which controls the entire system in response to operator instructions received from a terminal 416. A monitor 404 is connected to the digital-to-analog converter 406 and permits displaying the processed image contained in storage 407.

Storage unit 407 has three storage blocks 421, 422, and 423, each accommodating a completely digitized image with 512×512 picture elements, thus having a storage capacity of 256 kilobytes. A storage block, e.g., 421, is connected through an 8-bit bus 408 to the A/D and D/A converter 406, and contains the image received or the image to be displayed on monitor 404. Each of the storage blocks 421, 422, and 423 can be selectively connected to any one of the three 8-bit buses 409, 425, and 426 by actuating one of the switches 424. Switches 424 contain known multiplex circuits which are permanently connected to each of the buses 409, 425, 426 and which selectivly connect both the data and the control lines of each bus to the storage block associated with them. The operation of switches 424 is controlled by microprocessor 417. The switchable buses 409, 425, and 426 permit an independent storage operation to be performed between each of the storage blocks 421-423 and the microprocessor 417 or the processing unit 411. Two of the storage blocks, for example, are capable of supplying image data for processing (for addition or subtraction of the two images), while the results of this processing step are written into the third storage block. As during the processing of each picture element the image data have to be read out and subsequently written back in, the processing speed is considerably increased by the simultaneous operation of three storage units.

FIG. 6 is a block diagram of a device interconnected between the processing unit 411 and the image storage 407 and by means of which the processing of the marker bit is accelerated in the second method step. Each picture element, read out through one of the buses 409, 425, 426 in the second method step, is buffered in a latch 61. If the processing unit 411 (see also FIG. 5) determines that the marker bit has been set in this picture element, a write instruction is given which together with the inverted signal for the marker bit in AND gate 68 generates an inhibit signal for the driver 62 which would otherwise transmit data from the processing unit 411 to storage 407. Instead, the write signal together with the signal for the marker bit in AND gate 65 activates a driver 63 (tristate driver), by means of which the data stored in latch 61 are directly returned to the image storage 407 through the 8-bit buses 64 and 69. Thus, it is no longer necessary for the picture elements already processed to be buffered in and read from processing unit 411, so that for each of these picture elements several instructions otherwise needed are eliminated. The marker bit is set for the first time by the marker signal in OR gate 66.

FIG. 7 shows a circuit for fast address generation, for example, for edge tracing, as shown in FIG. 2. For that purpose it is essential to determine at high speed the addresses of picture elements lying in the vicinity of a selected picture element if tracing is effected in a horizontal, vertical or diagonal direction. In high-capacity image storages with, for example, 256 K-bytes, eighteen bit addresses are required, so that even with addresses of adjacent picture elements many bit positions of the address have to be changed. Microprocessors with their relatively small number of address lines, typically 8, thus require more cycles for generating the addresses of adjacent picture elements. For accelerating this address computation, the address $A_n$ of a picture element n in the vicinity of a picture element n−1 is represented in the following manner as a product of two terms.

$$A_n = A_{n-1} + X \cdot Y$$

where X and Y are the output signals of two programmable read-only storages 701, 702 which in turn receive input signals, designating in a coded form one of eight adjacent elements, from the processing unit 411 or the microprocessor 417 through 3-core control lines 703.

The PROM output signals X and Y are subsequently stored in a 512×512 image storage, for example:

| X | Y | X · Y | requested address direction |
|---|---|---|---|
| 1 | 1 | 1 | 0° = + X |
| 1 | −1 | −1 | 180° = − X |
| 16 | 32 | 512 | 90° = + Y |
| −16 | 32 | −512 | 180° = − Y |
| 7 | 73 | 511 | 135° |
| −7 | 73 | −511 | 315° |
| 9 | 57 | 513 | 45° diagonals |
| −9 | 57 | −513 | 225° |

The PROM output signals are multiplied in a multiplier 707 and added in adder 708 to the address $A_{n-1}$ of the picture element n−1, which is stored in accumulator register 705. The arithmetic units 707, 708 and the accumulator 705 are embodied, for example, as an integrated circuit 704. The interconnecting lines between the PROMs 701, 702 and the multiplier 707 have eight cores, whereas the address lines 706, 709 connected to ACCN 705 have eighteen cores.

Figure 8A:
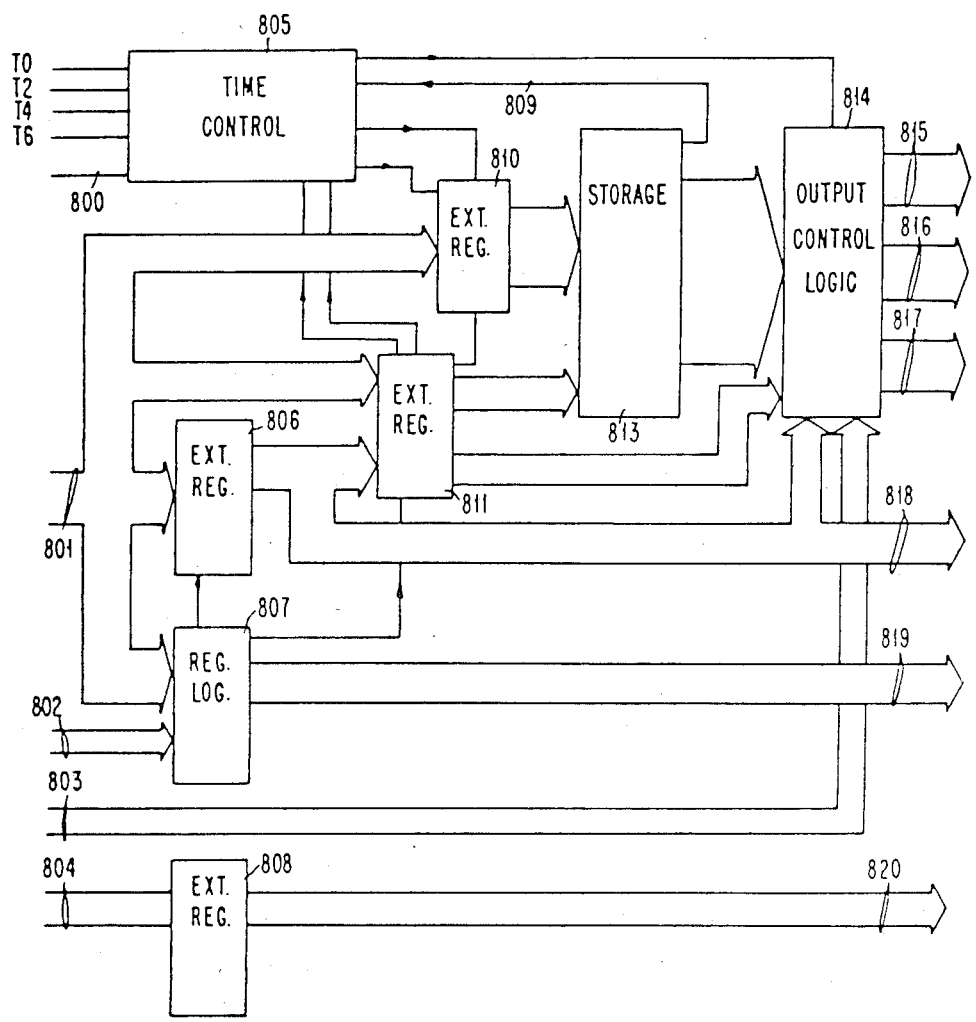
FIGS. 8A and 8B show block diagrams of the processing unit in the apparatus according to FIG. 4.
Figure 8B:
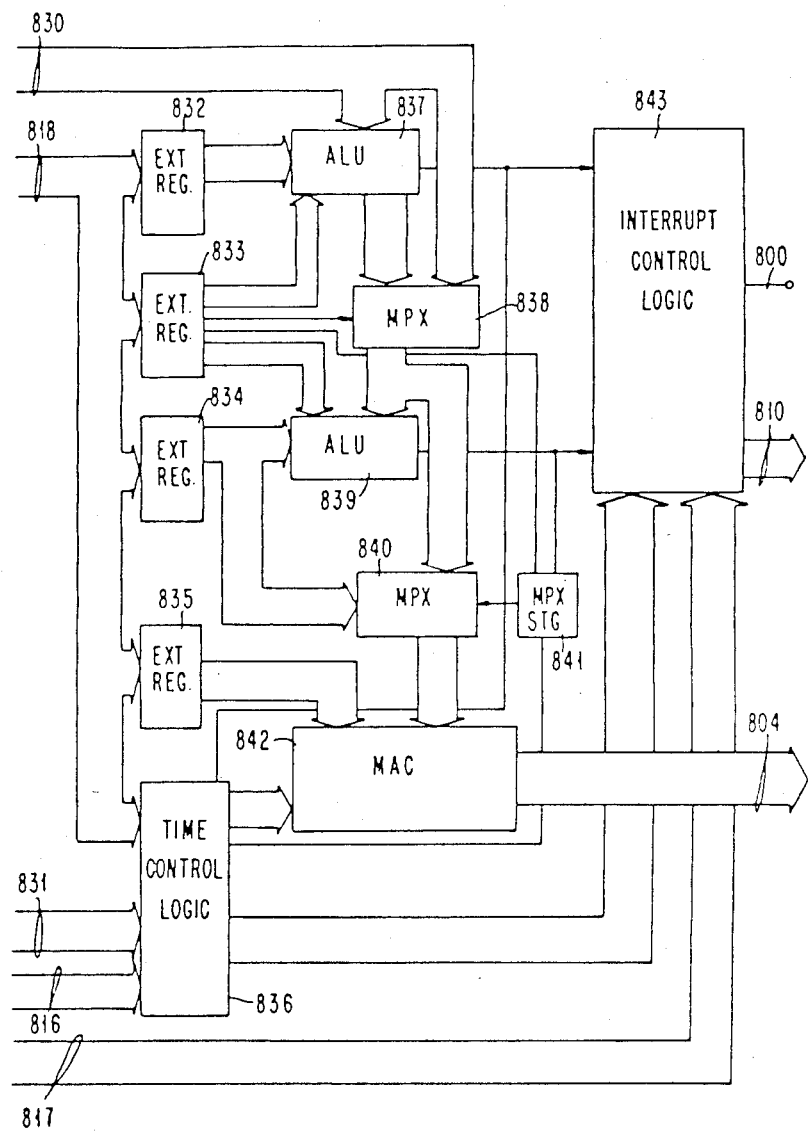

FIGS. 8A and 8B are schematics of the structure of processing unit 411 having two parts: (i) a control sequencer shown in FIG. 8A; and (ii) a circuit card, adapted to the respective function to be performed by the processing unit, which can be plugged into the control circuit. FIG. 8B shows an example of the block diagram for such a plug card.

The sequencer according to FIG. 8A controls the functions of the connected plug card and is itself controlled by the microprocessor. It comprises a number of registers 806, 808, 810, 811 which can be directly addressed by the microprocessor through address bus 802, and accommodate data from the buses (e.g., bus 801) or emit data to the buses (e.g., bus 820) connected to the microprocessor and other components. A register control logic 807 serves to control the data traffic between these registers and the microprocessor. These so-called external registers of the microprocessor can be directly addressed by its instructions. One of the registers 810 serves as an address register for a read/write storage 813 and is designed as a counter to automatically successively address several storage addresses. The control information that has to be applied to the control inputs of the plug card for performing a particular function is stored in storage 813. A particular functional sequence is invoked if the contents of counter 810 are incremented by the microprocessor and the time control 805 is put into operation by the contents of register 811 which is also loaded by the microprocessor. The output signals of the storage 813 are emitted through an output control logic 814. The control signals for the plug card subsequently appear on a bus 816, whereas control signals for the storage 813 appear on a bus 815 and diagnostic signals on a bus 817. The step sequence initiated by the contents of counter register 810 is terminated when the last control information is read from storage 813. In this control information, a particular control bit, e.g., bit 0, stops time control 805 through line 809, with the time control discontinuing the incrementation of the counter register 810. The time control 805 operates synchronously with the machine clocks T0 to T6 of the microprocessor. Time control 805 can also be stopped by an external interrupt signal on line 800 if, for instance, an error such as "threshold exceeded" has occurred during the processing of the image data.

The control information fed from the microprocessor to the external register 806 may be passed on to the plug card (see FIG. 8B) through bus 818. Results which are returned on bus 804 from the plug card to the control unit reach the microprocessor through the external register 808 and the bus 820. Synchronization signals for the operation of the storage are fed to the output control logic 814 through bus 803. Bus 819 is connected to further external registers of the microprocessor.

Arbitrary step sequences, which are also capable of controlling complicated processing sequences in the connected plug cards, can be defined by means of the control unit according to FIG. 8A by suitably programming the storage 813 and writing the appropriate values into the external registers.

FIG. 8B shows an example of a plug card, by means of which the grey values of a digitalized image are tested to determine whether they are within predetermined threshold values. This card may also be used to accurately determine line widths in digitized images.

The plug card schematically represented in FIG. 8B is connected to the storage unit 407 by bus 830, through which it receives picture element information to be processed, feeding said information as operands to a first arithmetic unit 837 or through a multiplexer 838 to a second arithmetic unit 839. The control data bus 818 from the control unit is connected to several external registers 832 to 835, registers 832 and 834 of which are linked with the arithmetic units 837 and 839, respectively. Register 833 is connected to the arithmetic units 837 and 839 and the multiplexer 838 through control lines. Register 835 is connected to a circuit 842 (multiplier/adder MAC) which multiplies two values received (X, Y) and adds the results successively obtained. This circuit 842 is, for example, available as an integrated circuit. In the circuit card according to FIG. 8B, the second input is connected to the multiplexer 840 which in turn is connected to the output of the arithmetic unit 839 and the output of the first multiplexer 838. Multiplexer 840 is also connected to register 834.

Arithmetic units 837 and 839 supply status information about the result of the computation to an interrupt control logic 843, by means of which the interrupt line 800 can be activated. A diagnostic bus 810 is also connected to the interrupt control logic 843. A time control logic 836 receives the control signals of the control unit on bus 816 and can be loaded with storage data through bus 831. The results of the multiplier/adder 842 can be fed on bus 804 to the control unit. The selection signals for the multiplexers 838, 840 are supplied by register 833 and the MPX control 841, respectively.

For determining whether a digital image value read from storage 407 is within predetermined threshold limits, the value of the lower threshold $TH_{min}$ is read into register 832 and the value of the upper threshold $TH_{max}$ into register 834. The arithmetic units 837 and 839 subsequently compare the value of the binary word read in through bus 830 and apply a control signal to the interrupt control logic 843 if the threshold values have been exceeded.

In a second operating mode of the circuit card according to FIG. 8B, the picture elements meeting the permissible grey values are multiplied in the multiplier/adder 842 by a normalizing constant stored in register 835. Processing of all picture elements occurring when a conductor is scanned yields a measure of the accurate conductor width, as will be explained below by means of FIG. 9.

FIG. 9A shows the profile 91 of a conductor, which is received when a photodetector is led across the conductor path 92 with edges 93 and 96. After digitization, the profile appears as a step curve 94. The width 97 of each step corresponds to the lateral extension width of a picture element and is indicative of the uncertainty with which the accurate position of an edge, e.g., 98, can be determined. The edge position is defined, for example, as point 99 at which the intensity of the profile rises by 50% above $I_{min}$, the base line signal represented by 111. This digitization error occurs in all binary representations of images or intensity profiles, for which the picture elements are black- or white-controlled by comparing their grey value with the fixed threshold.

To increase the measuring resolution so that it is less than the width of a picture element, all grey values along the profile 91 of the circuit card described by means of FIG. 8B are integrated, after these grey values have been normalized with respect to the maximum signal $I_{max}$. To suppress noise factors, integration considers only those grey values, the intensity of which is above $I_{min}+\Delta$ and less than $I_{max}-\Delta$, where $\Delta$ is the maximum noise contribution in the photodetector output signal. The integration result indicates the area below the normalized trapezoidal edge profile 95 in FIG. 9B. By means of the trapezoidal rule, the accurate position of edge 98 is subsequently computed from a rectangle with the side length L, which has the same surface as the trapezoid.

For computing conductor widths in the circuit card according to FIG. 8B, the registers 832 and 834 are loaded with the values $I_{min}+\Delta$ and $I_{max}\Delta$. The normalizing constant $I_{max}$ is stored as a reciprocal in register 835, if necessary, with a constant multiplication factor, in order to avoid values of less than 1 during normalizaton.

Grey values transmitted on bus 830, which are within $I_{min}+\Delta$, $I_{max}-\Delta$, are fed directly to the multiplier/adder 842. Values that are less than $I_{min}+\Delta$ are suppressed, higher values are reduced to the value $I_{max}-\Delta$. The latter two functions are performed by the control unit of FIG. 8A which is activated by the microprocessor if an interrupt signal has occurred on line 800.

For processing each individual picture element, the processing unit 411 is activated by an instruction from the connected microprocessor. Thus different picture elements can be subjected to different processing steps. The cycle time of the microprocessor and the time requirements of the processing unit 411 for an operation are preferably such that taken together they are less than or equal to the access time of the storage unit 407, so that the full storage access speed can be utilized. The heavy data flow from the image storage to the processing unit 411 is interrupted only if the latter detects conditions which have to be processed by the microprocessor, for which purpose an interrupt signal is emitted.

The processing unit 411 with a universal control unit according to FIG. 8A and circuit cards, which are individually tailored to the respective processing problem and can be plugged into tne control unit, permits performing a plurality of image processing functions at high speed.

Although the invention has been described in terms of specific structure and testing steps, it will be obvious to those skilled in the art that any many modifications and alterations may be made thereto without departing from the spirit and scope of the invention.

What is claimed is:

1. A method for the automatic optical inspection of a digitized substantially two-dimensional image, said image having edge regions and non-edge regions and being stored in an image storage as a plurality of grey values representing the lightness or darkness of one of a plurality of picture elements constituting said image, said edge regions being transitions from light regions to dark regions comprising the steps of:

scanning all edge regions of said image;

marking said scanned edge regions in said image storage such that all non-marked non-edge regions should contain only grey values corresponding to a light region or a dark region; and sequentially addressing all non-marked non-edge regions of said image storage to determine whether grey values other than those corresponding to light or dark regions exist.

2. A method according to claim 1 wherein the scanning step includes a step of addressing said edge regions by using a meander scanning track having a plurality of picture elements.

3. The method of claim 2 additionally comprising a step of summing the grey values of picture elements lying in sections of said meander scanning track perpendicular to said edge regions.

4. The method of claim 3 additionally comprising a step of taking the difference in grey values between adjacent sections of said meander scanning track.

5. The method of claim 3 wherein said sections of said meander scanning track perpendicular to said edge regions comprises three picture elements.

6. The method of claim 1 wherein said marking step includes a step of marking all non-defective picture elements of said scanned edge regions and placing a marker bit in a stored work in said image storage associated with each of said non-defective picture elements.

7. The method of claim 6 wherein said addressing step comprises the step of examining non-marked picture elements for grey values outside a predetermined range.

* * * * *